(12) United States Patent
Ikeda (10) Patent No.: US 7,195,715 B2
(45) Date of Patent: Mar. 27, 2007

(54) METHOD FOR MANUFACTURING QUARTZ OSCILLATOR

(75) Inventor: Tomoo Ikeda, Tokorozawa (JP)

(73) Assignee: Citizen Watch Co., Ltd., Tokyo (JP)

( * ) Notice: Subject to any disclaimer, the term of this patent is extended or adjusted under 35 U.S.C. 154(b) by 125 days.

(21) Appl. No.: 10/853,504

(22) Filed: May 26, 2004

(65) Prior Publication Data

US 2004/0241997 A1    Dec. 2, 2004

(30) Foreign Application Priority Data

May 27, 2003    (JP)    ............... 2003-148793

(51) Int. Cl.
*C03C 15/00*    (2006.01)

(52) U.S. Cl. ............... 216/40; 216/41; 216/49; 216/56; 216/83; 216/97; 430/312; 430/319

(58) Field of Classification Search ............... None
See application file for complete search history.

(56) References Cited

U.S. PATENT DOCUMENTS 5,833,869 A * 11/1998 Haas et al. ............... 216/2

2005/0194352 A1* 9/2005 Satoh et al. ............... 216/41

FOREIGN PATENT DOCUMENTS

| JP | 56106412 A | | 8/1981 |
| JP | 56110320 A | * | 9/1981 |
| JP | 10270967 A | * | 10/1998 |
| JP | 11199400 A | | 7/1999 |

* cited by examiner

*Primary Examiner*—Anita Alanko
(74) *Attorney, Agent, or Firm*—Finnegan, Henderson, Farabow, Garrett & Dunner, L.L.P.

(57) ABSTRACT

A method for manufacturing quartz oscillators is provided which permits quartz oscillators having an oscillation frequency, as designed, to be obtained with small variation of individual oscillation frequency and with high reliability. The method for manufacturing quartz oscillators according to the present invention comprises the steps of forming a first resist layer (300) on one surface of a quartz substrate (100), exposing said first resist layer to light of a first amount of exposure to form a patterned first masking layer (210), forming a second resist layer (400) on the other surface of said quartz substrate, exposing said second resist layer to light of a second amount of exposure via said quartz substrate to form a patterned second masking layer (410) by using said first masking layer, and etching said quartz substrate to form quartz pieces (150) by using said patterned first masking layer and said patterned second masking layer.

17 Claims, 7 Drawing Sheets

METHOD FOR MANUFACTURING QUARTZ OSCILLATOR

FIELD OF THE INVENTION

The present invention relates to a method for manufacturing a quartz oscillator which can be utilized for quartz oscillation generators, gyro-sensors or the like and which have only small individual variations in the oscillation frequency.

BACKGROUND OF THE INVENTION

A quartz oscillator which is used for a quartz oscillation generator, a gyro-sensor, or the like, is conventionally manufactured using a method comprising the steps of cutting out a quartz piece of desired shape from a quartz substrate, forming electrodes for generating oscillation of the quartz piece, and mounting the quartz piece having electrodes formed thereon in a packaging container. As the oscillation frequency of a quartz oscillator depends to a large extent upon the external geometry of the quartz piece, the step of cutting out the quartz piece from the quartz substrate is an important step in determining the performance of the quartz oscillator.

Either a cutting process or an etching process has been conventionally employed in order to cut out quartz pieces from quartz substrates. In particular, as an etching process, in which the quartz substrate is chemically dissolved and processed, permits fine and precise processing to be performed, it is frequently used in the manufacture of miniature quartz oscillators.

An example of the method for manufacturing quartz pieces by means of an etching process is shown in FIG. 6 (see, Patent Reference 1 and Patent Reference 2). First, as shown in FIG. 6(a), masking layers 21 and 22 having light interruption capability are respectively formed on both sides of a quartz substrate 10, and a resist layer 31 of photosensitive material is formed on the masking layer 21 and a resist layer 32 of photosensitive material is formed on the masking layer 22.

Figure 6A:
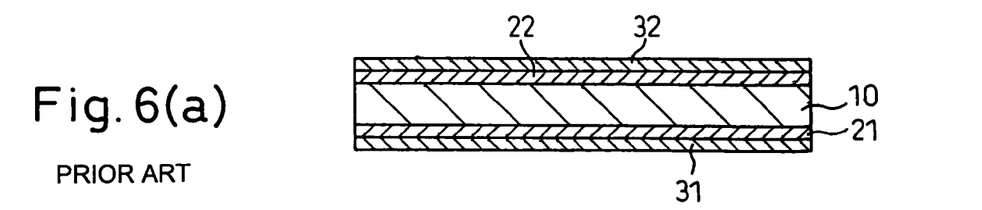
FIGS. 6(a)–(f) are views useful for explaining an example of conventional method for manufacturing quartz oscillators.
Figure 6B:
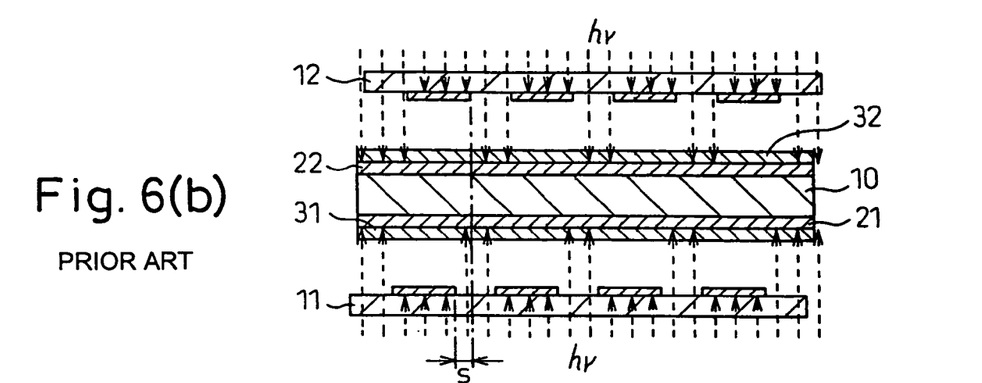

Then, as shown in FIG. 6(b), exposure masks 11 and 12 are disposed in parallel to the quartz substrate 10, and exposure to light is performed from both sides of the substrate 10 such that predetermined portions of the resist layers 31 and 32 are exposed to light.

Figure 6C:
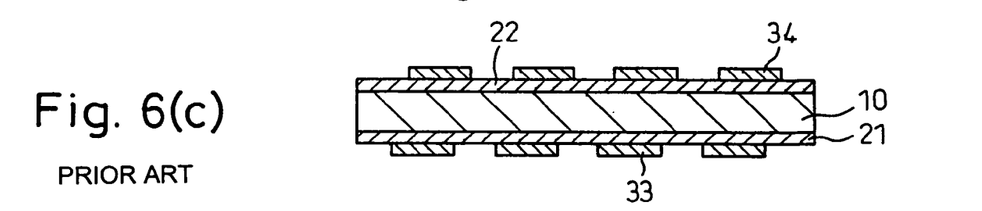
Figure 6D:
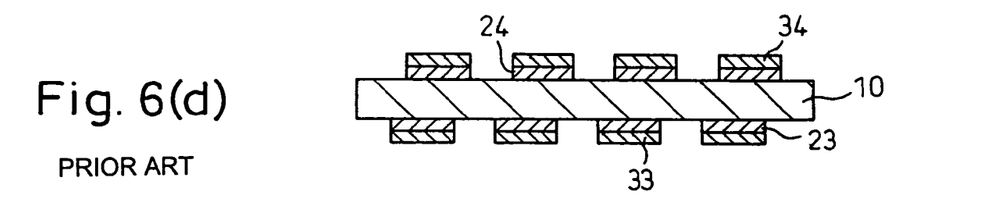

Next, using a special developing solution, the resist layers 31 and 32 are developed to form patterned resist layers 33 and 34 as shown in FIG. 6(c). Then, using the resist layers 33 and 34 as masks, the portion of the masking layers 21 and 22 which has no resist layers 33 and 34 formed is removed by dissolution with the etching solution. Patterned masking layers 23 and 24 as shown in FIG. 6(d) are thereby formed.

Figure 6E:
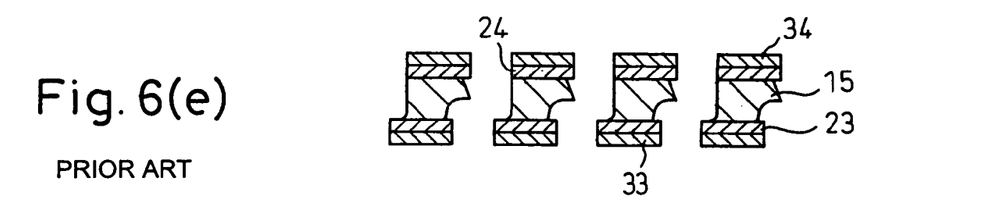
Figure 6F:
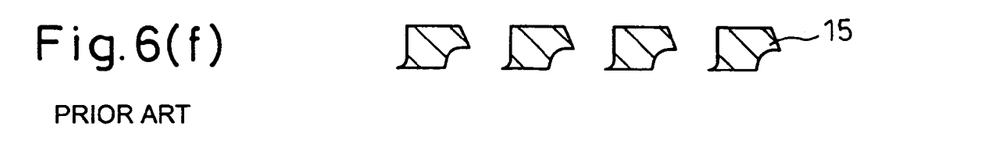

Then, as shown in FIG. 6(e), the quartz substrate 10 is subjected to etching by using the resist layer 33 and masking layer 23, and the resist layer 34 and masking layer 24, as masks, respectively, to cut out quartz pieces 15. Finally, as shown in FIG. 6(f), the resist layers 33 and 34, and the masking layers 23 and 24, are removed to obtain the quartz pieces 15.

Another example of conventional processing methods for processing quartz pieces by means of etching process is shown in FIG. 7 (see Patent Reference 3). First, as shown in FIG. 7(a), transparent films 41 and 42 are respectively formed on both sides of a quartz substrate 10, and a resist layer 31 of photosensitive material is formed on the transparent film 41 and a resist layer 32 of photosensitive material is formed on the transparent film 42.

Figure 7A:
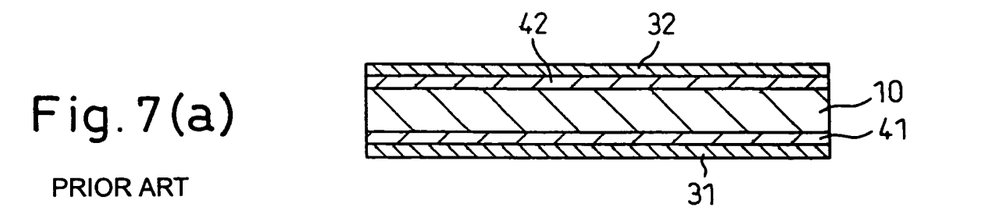
FIGS. 7(a)–(f) are views useful for explaining another example of conventional method for manufacturing quartz oscillators.
Figure 7B:
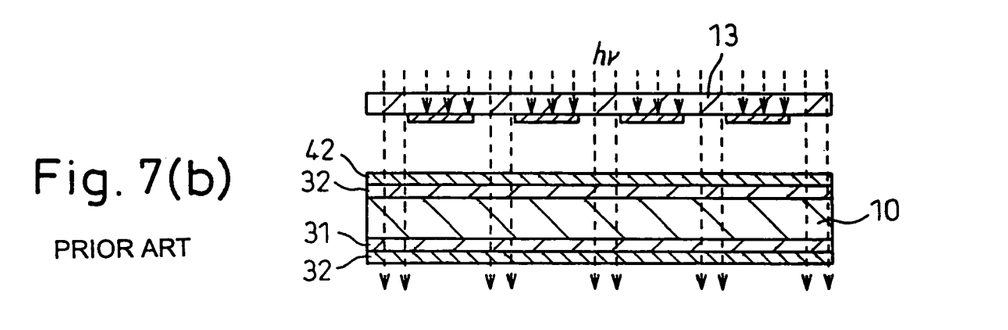

Then, as shown in FIG. 7(b), a exposure mask 13 is disposed in parallel to the quartz substrate 10, and light exposure is performed from one direction to expose predetermined portions of the resist layer 31 and 32 to light.

Figure 7C:
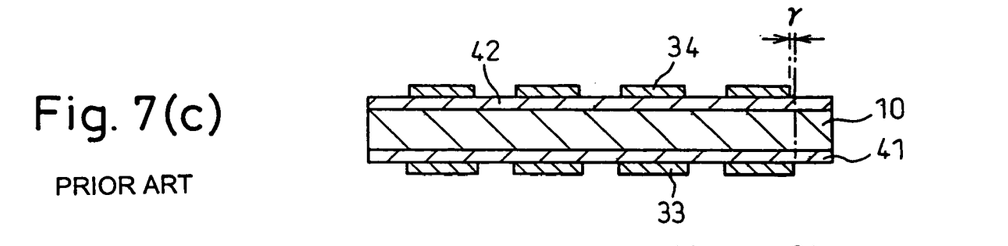
Figure 7D:
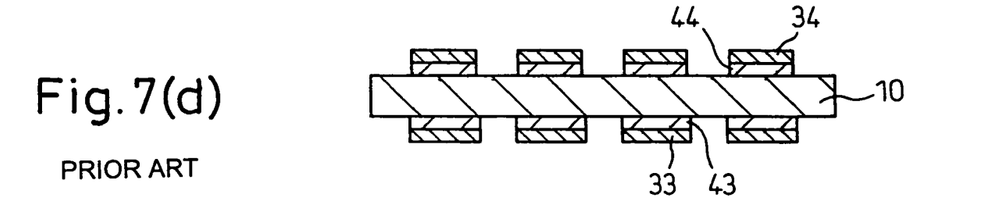

Next, using a special developing solution, the resist layers 31 and 32 are developed to form patterned resist layers 33 and 34 as shown in FIG. 7(c). Then, using the resist layers 33 and 34 as masks, the portion of the transparent film 41 and 42 which has no resist layers 33 and 34 formed is removed by dissolution with the etching solution. Patterned transparent films 43 and 44, as shown in FIG. 7(d), are thereby formed.

Figure 7E:
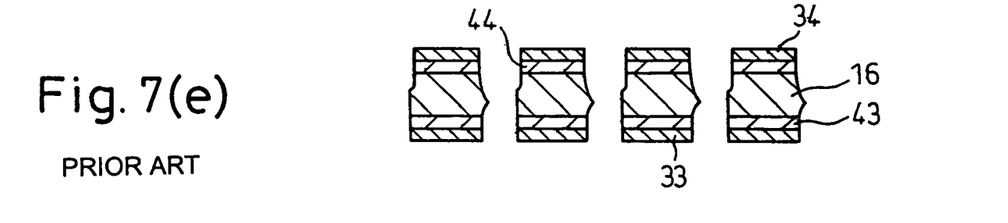
Figure 7F:
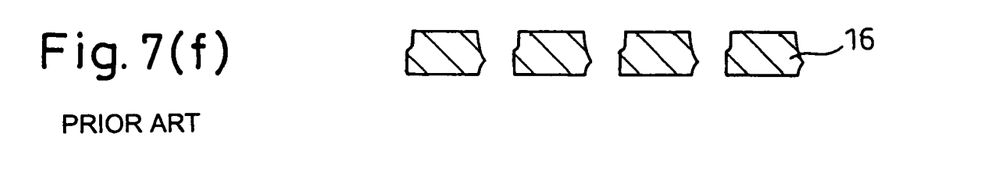

Then, as shown in FIG. 7(e), the quartz substrate 10 is subjected to etching by using the resist layer 33 and transparent film 43, and the resist layer 34 and transparent film 44, as masks, respectively, to cut out quartz pieces 16. Finally, as shown in FIG. 7(f), the resist layers 33 and 34, and the transparent films 43 and 44, are removed to obtain the quartz pieces 16.

Patent Reference 1: Japanese Patent Unexamined Publication No. S56-106412 (page 4, FIG. 1)
Patent Reference 2: Japanese Patent Unexamined Publication No. H11-199400 (page 1, FIG. 6)
Patent Reference 3: Japanese Patent Unexamined Publication No. H10-270967 (page 1, FIG. 3).

In the conventional etching process for processing quartz pieces as shown in FIG. 6, in order to obtain a quartz piece 15 which is symmetric with respect to the up and down direction (in the Figure), it is necessary to precisely position the patterns in the exposure masks 11 and 12 in the step shown in FIG. 6(b). For this purpose, it has been usual practice to provide an optical system that permits simultaneous observation of the upper and the lower surfaces (in the Figure) of the quartz substrate 10, and positioning of the exposure masks 11 and 12 is performed using a microscope with magnification of 10×–100×.

In order to be able to observe the position of the exposure masks 11 and 12 accurately, it is generally more desirable to use a microscope with high magnification (about 100×) than that with low magnification (about 10×). However, when a microscope with high magnification is used, it is difficult to focus at the same time on the exposure mask 11 and the exposure mask 12 which are disposed on opposing sides of the quartz substrate 10. Therefore, in the conventional method, irrespective of any attempt to position the exposure masks accurately, the positioning of the exposure mask 11 and 12 inevitably gives rise to shift (s) of about a few μm.

The shift (s) as shown in FIG. 6(b) leads finally to a quartz piece 15 having a distorted cross sectional shape as shown in FIG. 6(f). The quartz piece 15 having such a distorted cross sectional shape does not oscillate as designed. As a result, a quartz oscillator using such a quartz piece 15 does not have the design oscillation frequency and precision.

In addition, the shift (s) as shown in FIG. 6(b) is not constant in magnitude, but is variable in the order of at least a few μm. Therefore, the geometrical shapes of the quartz pieces 15 to be processed are not constant, but vary in the range of a few μm. As the oscillation frequencies of quartz oscillators depend upon the external geometry of the quartz pieces 15, the oscillation frequencies of the quartz oscillators manufactured from the variable quartz pieces 15 are also variable. As the oscillation frequencies of individual quartz oscillators is variable, product reliability is degraded.

In the method for processing a quartz piece using the conventional etching process as shown in FIG. 7, no centering of two exposure masks needs to be performed. However, as light transmission of the quartz substrate 10 is less than 100% (93–95%), light for exposing from one direction is attenuated and diffuses upon passage through the quartz substrate 10, and the light intensity for irradiating the resist 31 is reduced. As a result, the size of the portion of the resist 31 which is removed in the step of FIG. 7(c) is reduced so that the width of the pattern 33 is wider than the width of the pattern 34 by (r) (1–2 μm).

The difference (r) in FIG. 7(c) leads finally to formation of a quartz piece 16 having distorted cross sectional shape as shown in FIG. 7(f). The quartz piece 16 having such distorted cross sectional shape does not oscillate as designed and, consequently, a quartz oscillator manufactured by using the quartz piece 16 does not have the designed oscillation frequency and precision.

In addition, the difference (r) in FIG. 7(c) is not constant, but occurs in variable amounts. Therefore, the geometrical shapes of the processed quartz pieces 16 are not constant, but vary within a predetermined range. As the oscillation frequency of quartz oscillators depends upon the external geometry of the quartz pieces, the oscillation frequencies of the quartz oscillators manufactured from the variable quartz pieces 16 are also variable. As the oscillation frequencies of individual quartz oscillators are variable, product reliability is degraded.

SUMMARY OF THE INVENTION

It is an object of the present invention to provide a method for manufacturing a quartz oscillator that is capable of resolving above-described problems.

It is another object of the present invention to provide a method for manufacturing quartz oscillators, in which variability of oscillation frequencies among individual oscillators is small and which thus permits highly reliable quartz oscillators to be obtained.

It is still another object of the present invention to provide a method for manufacturing quartz oscillators, which permits a quartz piece having a symmetrical cross-sectional shape to be manufactured easily.

In order to attain the above objects, in accordance with the present invention, a method for manufacturing a quartz oscillator is provided, comprising the steps of forming a first resist layer on one surface of a quartz substrate, exposing the first resist layer to light of a first amount of exposure to form thereby a patterned first masking layer, forming a second resist layer on the other surface of the quartz substrate, forming a patterned second masking layer by exposing the second resist layer, exposing the second resist layer to light of a second amount of exposure via said quartz substrate to form a patterned masking layer by using the first masking layer, and etching the quartz substrate to form a quartz piece by using the patterned first and second masking layers.

Further, in the method for manufacturing a quartz oscillator according to the present invention, the first amount of exposure and the second amount of exposure are preferably selected such that the pattern of the patterned first masking layer has substantially the same shape as the pattern of the patterned second masking layer.

Further, in the method for manufacturing a quartz oscillator according to the present invention, the first masking layer preferably has corrosion resistance against the etching solution for etching the quartz substrate.

Further, in the method for manufacturing a quartz oscillator according to the present invention, the step of forming a patterned second masking layer preferably comprises the step of removing the exposed portion of the second resist layer exposed to light to thereby form the patterned second masking layer, and the second resist layer preferably has corrosion resistance against the etching solution for etching the quartz substrate, and is preferably formed of a photosensitive material which can be dissolved and removed upon exposure to light.

The method for manufacturing a quartz oscillator according to the present invention preferably further comprises the step of forming a transparent masking layer which is transparent and has corrosion resistance against the etching solution for etching the quartz substrate between the second resist layer and the quartz substrate, and the step of forming the patterned second masking layer preferably comprises the steps of forming the patterned second resist layer by removing exposed portion of the second resist layer exposed to light, and patterning the transparent masking layer to form the patterned second masking layer by using the patterned second resist layer as a mask.

Further, in the method for manufacturing a quartz oscillator according to the present invention, the step of forming the patterned masking layer preferably comprises the steps of forming the patterned second resist layer by removing the portion other than the exposed portion of the second resist layer exposed to light, forming a second masking layer on the patterned second resist layer, and removing the patterned second resist layer to form the patterned second masking layer.

The method for manufacturing a quartz oscillator according to the present invention preferably further comprises the step of forming a thin film masking layer between the second resist layer and the quartz substrate, and the step of forming the patterned second masking layer preferably comprises the steps of removing exposed portion of the second resist layer exposed to light to form the patterned second resist layer, and patterning the thin film masking layer to form the patterned second masking layer by using the second resist layer as a mask.

Further, in the method for manufacturing a quartz oscillator according to the present invention, the thin film masking layer is preferably a laminated film including an Au film and a Cr film having light transmission of 0.4%–1.7%, the Au film being 0.06–0.10 μm in film thickness and the Cr film being 0.01–0.05 μm in film thickness.

The method for manufacturing a quartz oscillator according to the present invention preferably further comprises the steps of attaching electrodes to the quartz piece, and mounting the quartz piece having the electrodes attached thereto in a container.

In the method for manufacturing a quartz oscillator according to the present invention, the patterned masking layer formed on one of the surfaces of the quartz substrate serves as an exposure mask for a resist layer formed on the other surface of the quartz substrate. Therefore, the need of positional adjustment of a plurality of exposure masks can be eliminated, and the masking layers formed on two surfaces of the quartz substrate can be accurately positioned relative to each other with sub-micron precision. As the need of positional adjustment is eliminated, the manufacturing process is simplified, leading to an improvement in work efficiency and to an improvement in productivity.

In the method for manufacturing a quartz oscillator according to the present invention, the first amount of exposure for forming a patterned masking layer on one surface of the quartz substrate and the second amount of exposure for forming a patterned masking layer on the other surface of the quartz substrate are separately controlled, and therefore, patterns of approximately the same shape can be formed on the two surfaces of the quartz substrate.

In the method for manufacturing a quartz oscillator according to the present invention, it has been possible to realize the external dimension of the quartz piece to within 1 μm of the design value, and the cross sectional shape was not distorted.

Further, in the method for manufacturing a quartz oscillator according to the present invention, the oscillation frequency of a quartz oscillator using a quartz piece can be realized within error of a few tens Hz from the design value, and a quartz oscillator can be manufactured with high precision and high reliability.

BRIEF DESCRIPTION OF THE DRAWINGS

The present invention will be more clearly understood from the description of preferred embodiments with reference to the drawings shown below.

DESCRIPTION OF PREFERRED EMBODIMENTS OF THE INVENTION

The method for manufacturing quartz oscillators according to the present invention will be described below with reference to drawings.

First, the method for manufacturing quartz oscillators according to a first embodiment of the present invention will be described with reference to FIGS. 1 and 2.

Figure 1A:
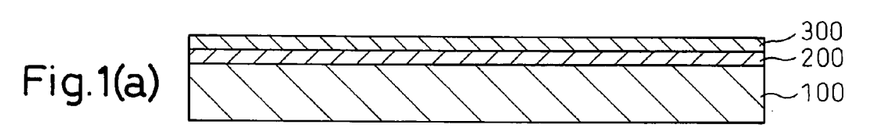
FIGS. 1(a)–(e) are views useful for explaining a method for manufacturing quartz oscillators according to a first embodiment of the present invention.

As shown in FIG. 1(a), a masking layer 200 was formed on one surface of a quartz substrate 100 by sputtering method or vapor deposition method over the entire surface. The masking layer 200 was a laminated film (Au/Cr film) consisting of an upper Au film and a lower Cr film (on the side of the quartz substrate 100). The Au film had film thickness of 0.15 μm and the Cr film had film thickness of 0.05 μm. A resist layer 300 was formed on the entire upper surface of the masking layer 200. The resist layer 300 was formed by coating a positive-type resist manufactured by Clariant Co. (Trade name: AZ-P1350) using spin coating method (2000 rpm, 30 seconds) to the thickness of about 1 μm and thereafter pre-baking (heat curing processing before exposure to light) in an air circulating oven (90° C., 20 minutes).

Figure 1B:
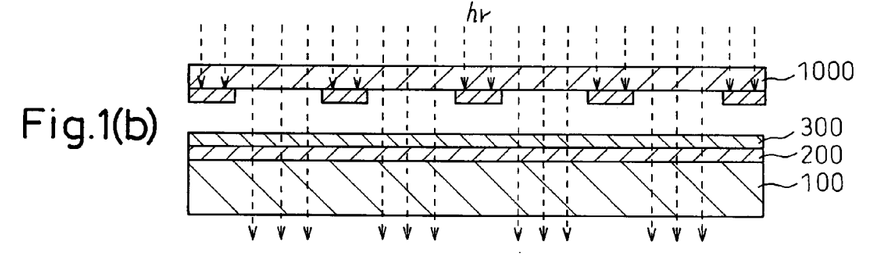

Next, as shown in FIG. 1(b), a mask 1000 was disposed in parallel to the quartz substrate 100, and a first exposure was performed to expose a predetermined portion of the resist layer 300 to light. The amount of the first exposure was chosen to be 50 mJ/cm².

Figure 1C:
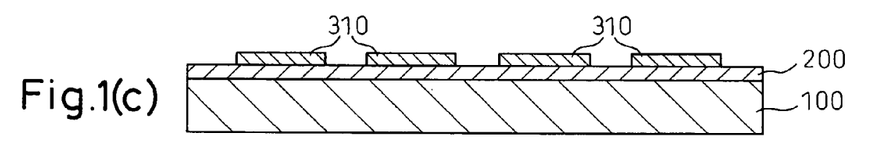

Then, the resist layer 300 was developed to form a patterned resist layer 310 as shown in FIG. 1(c). A special developing solution for AZ-P1350 was used for the development. As a positive-type resist was used to form the resist layer 300, only those portions which had been exposed to light were removed.

Figure 1D:
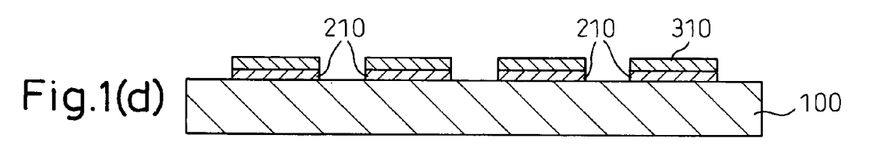

Next, the patterned resist layer 310 was used as a mask to perform etching of the masking layer 200 to form a patterned masking layer 210 as shown in FIG. 1(d). Etching was performed using aqua regia for the Au film and a nitric acid-based etching solution for the Cr film.

Figure 1E:
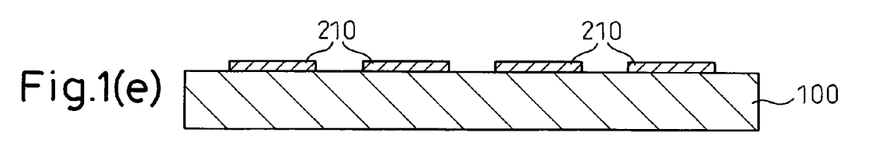

Then, as shown in FIG. 1(e), the resist 310 was removed. The resist 310 was removed by using a special release solution for AZ-P1350.

Figure 2F:
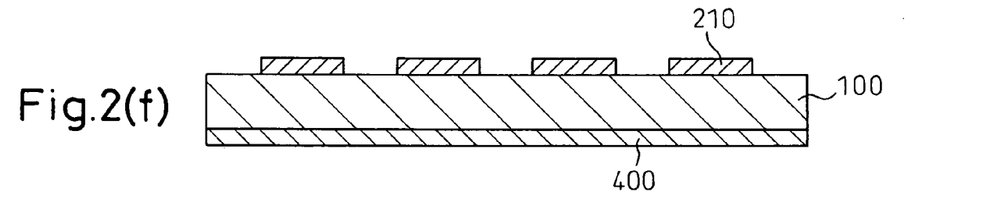
FIGS. 2(f)–(j) are views useful for explaining a method for manufacturing quartz oscillators according to a first embodiment of the present invention.

Next, as shown in FIG. 2(f), a resist layer 400 was formed on the other surface of the quartz substrate 100 on which the masking layer 210 has not been formed. The resist layer 400 was formed by coating a positive-type resist manufactured by Clariant Co. (Trade name AZ-P1350) by spin coating method to the thickness of about 1 μm, and pre-baking the coated film in an air circulating oven (90° C., for 20 minutes).

Figure 2G:
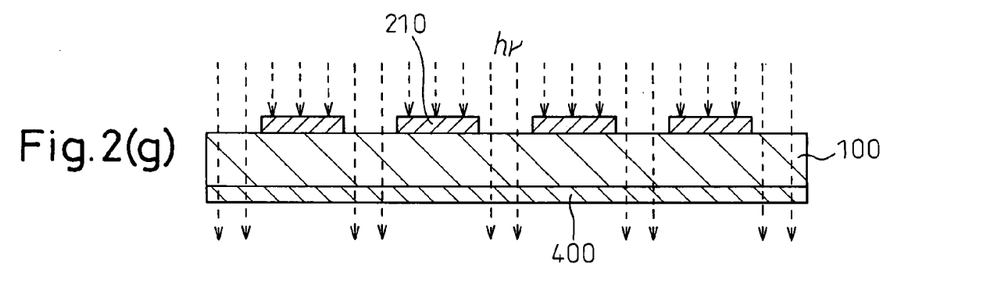

Next, as shown in FIG. 2(g), a second exposure was performed from the side of the quartz substrate 100 having the masking layer 210 formed thereon via the quartz substrate 100 to expose a predetermined portion of the resist layer 400 to light. Light is interrupted by the masking layer 210 and does not reach the portion of resist layer 400 where the masking layer 210 has been formed. Light reaches only those portion of resist layer 400 where quartz substrate is exposed. It is thus possible to expose the resist layer 400 to light in accordance with the pattern of the masking layer 210. The amount of the second exposure was chosen to be 60 mJ/cm².

Figure 2H:
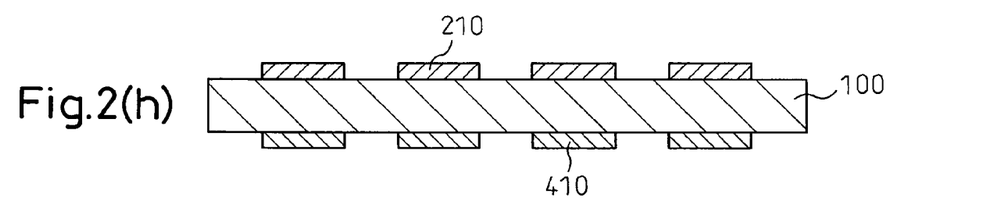

Then, as shown in FIG. 2(h), a patterned resist layer 410 was formed by developing and partially removing the resist layer 400. As has been described, as the resist layer 400 has been formed using a positive type resist, only those portions which has been exposed to light are removed. Thus, a patterned resist layer 410 was formed in the same manner as the masking layer 210. Special developing solution for AZ-P1350 was used for development.

Figure 2I:
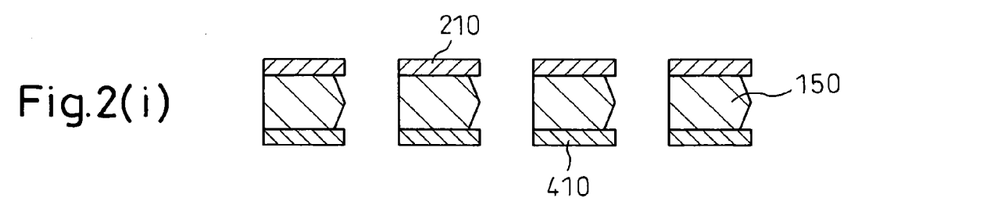

Then, as shown in FIG. 2(i), the patterned masking layer 210 and the patterned resist layer 410 were respectively used as masks to perform etching of the quartz substrate 100 to cut out quartz pieces 150. The etching was performed by soaking the quartz substrate 100 in an aqueous etching solution of 50% hydrofluoric acid for 3 hours at 50° C. In this process, neither the masking layer 210 formed of Au/Cr film nor the resist layer 410 formed of the positive type resist AZ-P1350 was corroded by the etching solution.

Figure 2J:
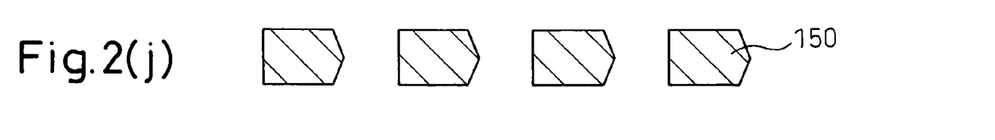

Usually, quartz etches at different rate depending upon the etching direction. This phenomenon is generally referred to as anisotropic etching. For this reason, inclined shape as shown in FIG. 2(j) is inevitably formed on one side of the etched quartz piece. However, as this inclined shape is determined by the crystal structure of the quartz, it is formed stably in a definite amount. Therefore, variations of the external shape of quartz pieces 150 does not occur in the etching process.

Finally, as shown in FIG. 2(j), the masking layer 210 and the masking layer 410 were removed to complete the quartz pieces 150. In this step, the masking layer 210 consisting of Au/Cr film was dissolved and removed by aqua regia and nitric acid-based etching solution, and the resist layer 410 formed of AZ-P1350 was dissolved and removed by acetone.

Then, the step of forming electrodes for inducing oscillation in the quartz piece and the packaging step of mounting the quartz piece having electrodes formed thereon in a plastic container or the like, were performed to complete a quartz oscillator. Various methods known in the art can be employed in the electrode forming step and the packaging step.

The step shown in FIG. 2(*g*) is the most important step that is characteristic of the manufacturing method according to the present embodiment, wherein the patterned masking layer 210 formed on the quartz substrate 100 serves as the exposure mask for the other surface of the quartz substrate 100. As a result, the need for positional adjustment of plural exposure masks can be eliminated.

Also in the present embodiment, the first exposure for forming the masking layer 210 and the second exposure for forming the resist layer 310 are performed separately, and are controlled such that the pattern of the masking layer 210 and the pattern of the resist layer 410 have the same shape. When the resist layer 400 is exposed to light in FIG. 2(*g*) (the second exposure), light is attenuated and diffused in accordance with the light transmission of the quartz substrate 100. Therefore, if the amount of exposure in the case of exposing the resist layer 300 to light in FIG. 2(*b*) (the first exposure) is the same as the amount of exposure in the case of exposing the resist layer 400 to light in FIG. 2(*g*) (the second exposure), the shape of the pattern of the resist layer 410 in FIG. 2(*h*) becomes larger than the shape of the pattern of the masking layer 210. This occurs because the resist layer 400 is a positive type resist and the portion exposed to light is removed in the step of FIG. 2(*h*). Therefore, in the manufacturing method of the present embodiment, the amount of exposure in the second exposure shown in FIG. 2(*g*) is increased from the amount of exposure in the first exposure, such that the shape of the pattern of the resist layer 410 is controlled to be the same as the pattern of the masking layer 210. This permits the cross sectional shape of the finally produced quartz piece to be formed as designed. The values of the amount of the first exposure and the second exposure in the present embodiment are only an example, and those skilled in the art can choose optimal values depending upon the thickness, light transmission, etc., of the quartz substrate 100.

In contrast, in the conventional example as shown in FIG. 7, the patterns on both sides of the quartz substrate are simultaneously formed in a single exposure, so that difference in the size of the formed pattern is produced between the side facing the light source and the opposite side.

In the method for manufacturing quartz oscillators according to the present embodiment, the quartz pieces could be formed with external dimensions within an error of 1 μm or less from the design value, and the cross sectional shape was not distorted. Further, the error of the oscillating frequency of the quartz oscillators using the quartz pieces produced by the method described in FIGS. 1 and 2 could be kept to several tens of Hz from the design value. This is remarkable difference from the case of conventional quartz oscillators where oscillating frequency varies over the range of about 200 Hz from the design value.

The method as described in FIGS. 1 and 2, the patterned masking layer 210 formed on one surface of the quartz substrate 100 serves as the exposure mask for exposing the other surface to light. Therefore, positional adjustment of plural exposure masks is not required, and the process can be simplified. Production of quartz pieces having distorted shapes, that may be produced due to error in positional adjustment of plural masks, can be avoided.

Thus, in accordance with the present invention, it is possible to manufacture quartz oscillators with high precision and high reliability.

Next, a method for manufacturing quartz oscillators according to a second embodiment of the present invention will be described with reference to FIG. 3. In this embodiment, a transparent masking layer is used to form quartz pieces.

First, as shown in FIG. 3(*a*), a necessary patterned masking layer 210 was formed on one surface of a quartz substrate 100. The masking layer 210 was a laminated film (Au/Cr film) consisting of an upper Au layer of 0.1 μm in thickness and lower Cr layer of 0.05 μm in thickness. The method of forming the masking layer 210 was otherwise the same as the method shown in FIGS. 1(*a*)–(*e*) including the amount of the first exposure (see FIG. 1(*b*)), and detailed description thereof is therefore omitted.

Figure 3A:
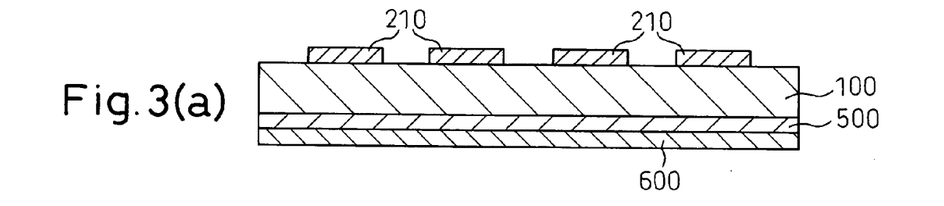
FIGS. 3(a)–(f) are views useful for explaining a method for manufacturing quartz oscillators according to a second embodiment of the present invention.

On the other surface of the quartz substrate 100 having no masking layer 210 formed thereon, a transparent masking layer 500 was formed all over the surface, and a resist layer 600 was formed on top of it. The transparent masking layer 500 in the present embodiment was aluminum oxide film formed, by a sputtering method, to a thickness of 0.1 μm. Any material may be used for the transparent masking film 500 as long as it is transparent and has corrosion resistance to the etching solution used in the etching step of etching the quartz substrate. The resist layer 600 in the present embodiment was formed by coating a positive type resist manufactured by Tokyo Ohka Co. (Trade name OFPR800) by spin coating method (2000 rpm, 30 seconds) to thickness of about 1 μm and pre-baking in an air circulating oven (90° C., for 20 minutes).

Then, as shown in FIG. 3(*b*), a second exposure was performed from the side of the quartz substrate 100 having the masking layer 210 formed thereon, through the quartz substrate 100 and the transparent masking layer 500 to expose a predetermined portion of the resist layer 600 to light. In the portion where the masking layer 210 had been formed, light was interrupted by the masking layer 210, and therefore, did not reach the resist layer 600. In the portion where the quartz substrate 100 was exposed, light does reach the resist layer 600, and the resist layer 600 was thus exposed to light in accordance with the pattern of the masking layer 210. The amount of exposure of the second exposure was chosen to be 65 mJ/cm$^2$.

Then, a patterned resist layer 610 was formed by partially removing the resist layer 600 by development. As has been described before, as the resist layer 600 is formed of a positive type resist, only those portions having been exposed to light were removed by development. Therefore, a patterned resist layer 610 patterned in the same way as the masking layer 210 was formed. A special developing solution for OFPR800 was used for development of the resist layer 600. Then, the resist layer 610 was used as a mask to perform etching of the transparent masking layer 500 to form the patterned transparent masking layer 510 as shown in FIG. 3(*c*). An aqueous solution of phosphoric acid was used for etching the transparent masking layer 500.

Then, as shown in FIG. 3(*d*), the resist layer 610 was removed. A special release solution for OFPR800 was used to remove the resist layer 610. A process shown in FIG. 3(*e*), to be described in the following, may be employed in place of the process shown in FIG. 3(*d*).

Figure 3B:
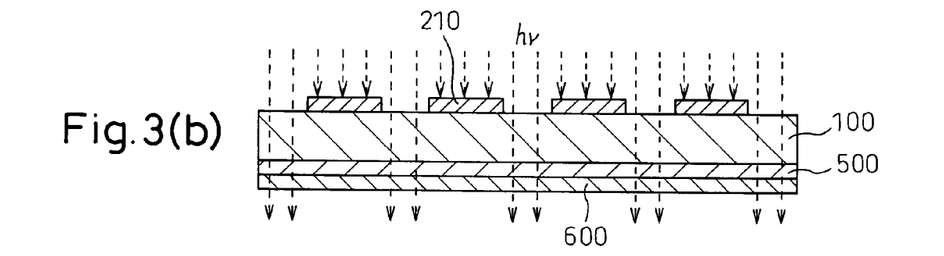
Figure 3C:
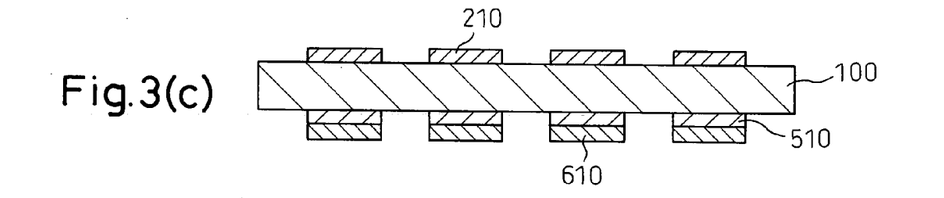
Figure 3D:
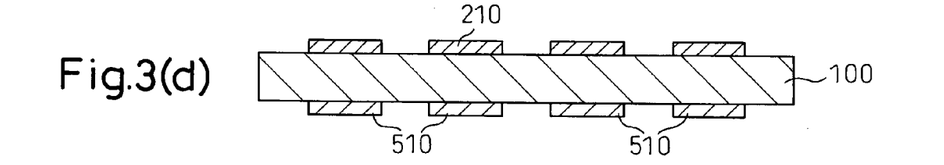
Figure 3E:
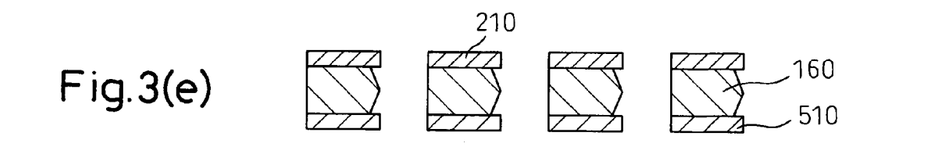

Then, as shown in FIG. 3(e), the patterned masking layer 210 and the patterned transparent masking layer 510 were used as masks for etching quartz substrate 100 to cut out quartz pieces 160. The etching was performed by soaking the quartz substrate 100 in an etching solution consisting of 50% aqueous solution of hydrofluoric acid at 70° C. for 2 hours. In this process, neither the masking layer 210 formed of Au/Cr film nor the transparent masking layer 510 formed of aluminum oxide film was corroded by the etching solution.

Usually, quartz is etched at different rate depending upon the etching direction. This phenomenon is generally referred to as anisotropic etching. For this reason, an inclined shape as shown in FIG. 3(e) is inevitably formed on one side of the etched quartz piece. However, since this inclined shape is determined by the crystal structure of the quartz, it is formed always in a definite amount. Therefore, variation of the external shape of quartz pieces 160 does not occur in the etching process.

Figure 3F:
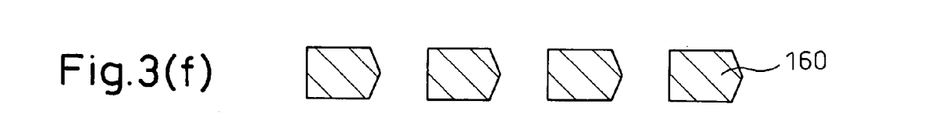

Finally, as shown in FIG. 3(f), the masking layer 210 and the transparent masking layer 510 are removed to complete the quartz pieces 160. In this step, the masking layer 210 formed of an Au/Cr film was dissolved and removed by aqua regia and nitric acid-based etching solutions, and the transparent masking layer 510 formed of AZ-P1350 was dissolved and removed by an aqueous solution of phosphoric acid.

Then, the step of forming electrodes for generating oscillation in the quartz piece and the packaging step of mounting the quartz piece having electrodes formed thereon in a plastic container or the like, are performed to complete a quartz oscillator. Various methods known in the art can be employed in the electrode forming step and the packaging step.

The step shown in FIG. 3(b) is the most important step that is characteristic of the manufacturing method according to the present embodiment, wherein the patterned masking layer 210 formed on the quartz substrate 100 serves as the exposure mask for the other surface of the quartz substrate 100. As a result, the need for positional adjustment of plural exposure masks can be eliminated.

In the present embodiment, the first exposure for forming the masking layer 210 and the second exposure for forming the resist layer 610 for forming the transparent masking layer 510 are performed separately, and are controlled such that the pattern of the masking layer 210 and the pattern of the transparent masking layer 510 have the same shape. When the resist layer 600 is exposed to light in FIG. 3(b) (the second exposure), light is attenuated and diffused in accordance with the light transmission of the quartz substrate 100 and the transparent masking layer 500. Therefore, if the amount of exposure in the case of exposing the resist layer 300 to light in FIG. 1(b) (the first exposure) is the same as the amount of exposure in the case of exposing the resist layer 600 to light in FIG. 3(b) (the second exposure), the shape of the pattern of the resist layer 610 in FIG. 3(c) becomes larger than the shape of the pattern of the masking layer 210. This occurs because the resist layer 600 is a positive type resist and the portion exposed to light is removed in the step of FIG. 3(c). Therefore, in the manufacturing method of the present embodiment, the amount of exposure in the second exposure shown in FIG. 3(b) is increased from the amount of exposure in the first exposure, such that the shape of the pattern of the transparent masking layer 510 is controlled to be the same as the pattern of the masking layer 210. This permits the cross sectional shape of the finally produced quartz piece 160 to be produced as designed. The values of the amount of the first exposure and the second exposure in the present embodiment are only an example, and those skilled in the art can choose optimal values depending upon the thickness, light transmission, etc., of the quartz substrate 100 and the transparent masking layer 500.

The quartz pieces manufactured in accordance with the method of the present embodiment, had external dimension within an error of 1 μm or less from the design value, and the cross sectional shape was not distorted. Further, the error of the oscillating frequency of the quartz oscillators using the quartz pieces produced in accordance with the method of the present embodiment could be kept to several tens Hz from the design value. This is remarkable difference from the case of conventional quartz oscillators where oscillating frequency varies over the range of about 2.00 Hz from the design value.

In the method of the present embodiment, the patterned masking layer 210 formed on one surface of the quartz substrate 100 serves as the exposure mask for exposing the other surface of the quartz substrate 100 to light. Therefore, positional adjustment of plural exposure masks is not required, and the process can be simplified. Also, quartz pieces having distorted shapes that may be produced due to errors in positional adjustment of plural masks can be avoided.

Further, as the transparent masking layer was used in the present embodiment, the etching solution could be used at higher temperature and in more highly activated state as compared to the first embodiment, so that processing time required for etching of the quartz substrate could be reduced.

Thus, in accordance with the present invention, it is possible to manufacture quartz oscillators with high precision and high reliability.

Next, a method for manufacturing quartz oscillators according to a third embodiment of the present invention will be described with reference to FIG. 4. In this embodiment, quartz pieces are processed using a lift-off method.

Figure 4A:
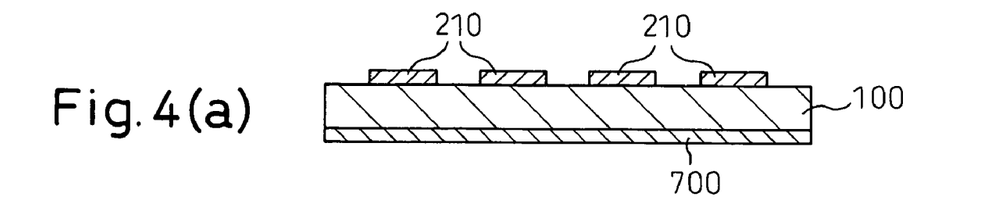
FIGS. 4(a)–(g) are views useful for explaining a method for manufacturing quartz oscillators according to a third embodiment of the present invention.

First, as shown in FIG. 4(a), a patterned masking layer 210 that was patterned as required was formed on one surface of a quartz substrate 100. The masking layer 210 was a laminated film (Au/Cr film) consisting of an upper Au film of 0.1 μm in thickness and a lower Cr film of 0.05 μm in thickness. The method of forming the masking layer 210 was otherwise the same as the method shown in FIGS. 1(a)–(e) including the amount of the first exposure (see FIG. 1(b)), and detailed description thereof is therefore omitted.

On the other hand, on the other surface of the quartz substrate 100 having no masking layer formed thereon, a resist layer 700 was formed all over the surface. The resist layer 700 in this embodiment was formed by coating a negative type resist manufactured by JSR Co. (Trade name: THB-130N) by spin coating method (2000 rpm, 30 seconds) to a thickness of about 10 μm, and then pre-baking on a hot plate (90° C., for 5 minutes).

Figure 4B:
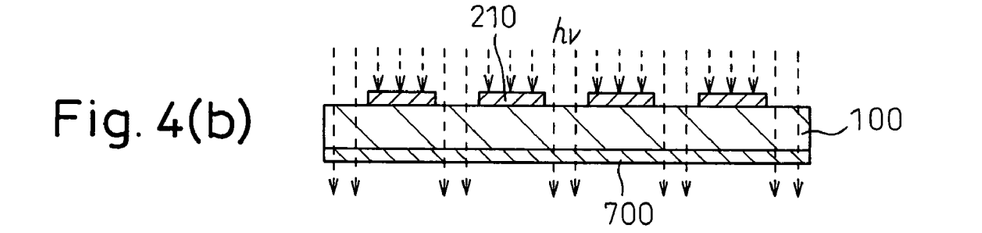

Then, as shown in FIG. 4(b), a second exposure was performed from the side of the quartz substrate 100 having the masking layer 210 formed thereon to expose a predetermined portion of the resist layer 700 to light. In the portion where the masking layer 210 had been formed, light was interrupted by the masking layer 210, and therefore, did not reach the resist layer 700. In the portion where the quartz substrate 100 was exposed, light does reach the resist layer 700, and the resist layer 700 was thus exposed to light in accordance with the pattern of the masking layer 210. The amount of exposure of the second exposure was chosen to be 250 mJ/cm$^2$.

Figure 4C:
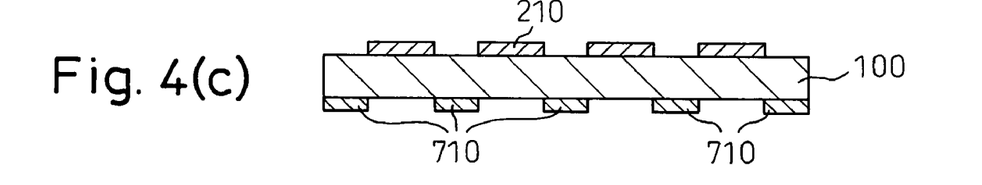

Then, as shown in FIG. 4(c), a patterned resist layer 710 was formed by developing and partially removing the resist layer 700. As has been described before, as the resist layer 700 has been formed using a negative type resist, the portion which has been exposed to light was insolubilized, and only a remaining portion, which has not been exposed to light, was removed. Thus, a patterned resist layer 710 was formed in the portion where the masking layer 210 has not been formed so as to sandwich the quartz substrate 100. A special developing solution for THB-130N was used for development.

Figure 4D:
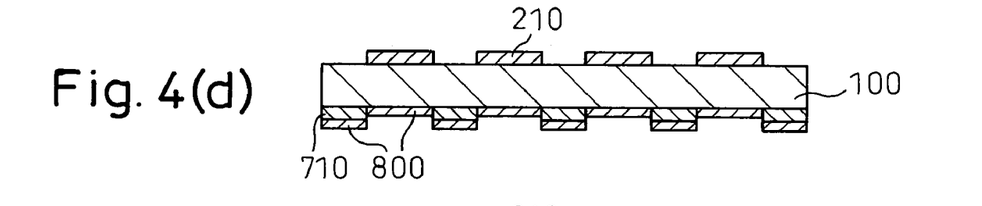

Then, on the surface of the quartz substrate 100 having the masking layer 710 formed thereon, a masking layer 800 was formed, using sputtering method, all over the surface. Like the masking layer 200, the masking layer 800 was a laminated film (Au/Cr film) that was composed of an upper Au layer and a lower Cr layer (on the side of the quartz substrate 100). Thickness of Au layer was 0.08 µm, and that of Cr layer is 0.03 µm.

Figure 4E:
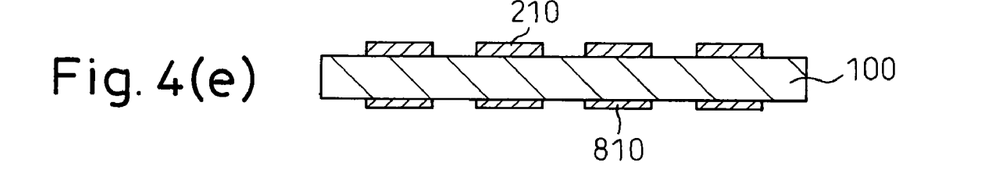

Then, as shown in FIG. 4(e), the masking layer 800 is partially removed on the resist layer 710 by dissolving and removing the resist layer 710 disposed beneath the masking layer 800. Such a patterning method is generally referred to as lift-off method. As a result, a patterned masking layer 810 was formed in the portion where the masking layer 210 had been formed so as to sandwich the quartz substrate 100. Special release solution for THB-130N was used to remove the resist layer 710 to perform the lift-off.

Figure 4F:
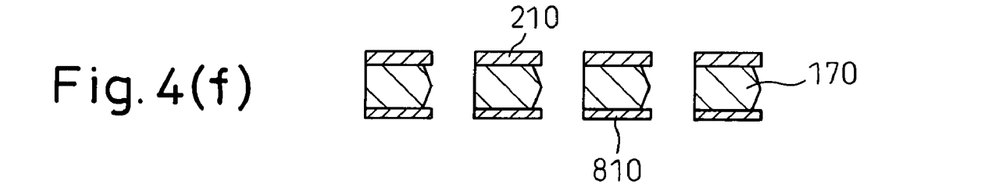

Then, as shown in FIG. 4(f), the patterned masking layer 210 and the patterned masking layer 810 were used as masks to perform etching of the quartz substrate 100 to cut out quartz pieces 170. The etching was performed by soaking the quartz substrate 100 in an aqueous etching solution of 50% hydrofluoric acid at 70° C. for 2 hours. In this process, neither the masking layer 210 formed of Au/Cr film nor the masking layer 810 also formed of Au/Cr film was corroded by the etching solution.

Usually, quartz is etched at different rate depending upon the etching direction. This phenomenon is generally referred to as anisotropic etching. For this reason, an inclined shape as shown in FIG. 4(f) is inevitably formed on one side of the etched quartz piece. However, as this inclined shape is determined by the crystal structure of the quartz, it is always formed in a definite amount. Therefore, variation of the external shape of quartz pieces 170 does not occur in the etching process.

Figure 4G:
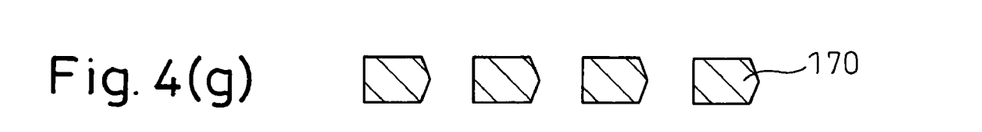

Finally, as shown in FIG. 4(g), the masking layer 210 and the masking layer 810 were removed to complete the quartz pieces 170. In this step, as the masking layers 210 and 810 were both formed of Au/Cr film, both surfaces were simultaneously dissolved and removed by aqua regia and nitric acid-based etching solutions.

Then, the step of forming electrodes for inducing oscillation in the quartz piece and the packaging step of mounting the quartz piece having electrodes formed thereon in a plastic container or the like, were performed to complete a quartz oscillator. Various methods known in the art can be employed in the electrode forming step and the packaging step.

The step shown in FIG. 4(b) is the most important step that is characteristic of the manufacturing method according to the present embodiment, wherein the patterned masking layer 210 formed on the quartz substrate 100 serves as the exposure mask for the other surface of the quartz substrate 100. As a result, the need for positional adjustment of plural exposure masks can be eliminated.

In the present embodiment, the first exposure for forming the masking layer 210 and the second exposure for forming the resist layer 710 for forming the masking layer 810 are performed separately, and are controlled such that the pattern of the masking layer 210 and the pattern of the masking layer 810 have the same shape. When the resist layer 700 is exposed to light in FIG. 4(b) (the second exposure), light is attenuated and diffused in accordance with the light transmission of the quartz substrate 100. Therefore, if the amount of exposure in the case of exposing the resist layer 300 to light in FIG. 1(b) (the first exposure) is the same as the amount of exposure in the case of exposing the resist layer 700 to light in FIG. 4(b) (the second exposure), the shape of the pattern of the resist layer 710 formed in FIG. 4(c) becomes narrower than the respective interval of the pattern of the masking layer 210 which is formed at a predetermined interval. This occurs because the resist layer 700 is a negative type resist and the portion other than that exposed to light is removed in the step of FIG. 4(c). Therefore, in the manufacturing method of the present embodiment, the amount of exposure in the second exposure shown in FIG. 4(b) is increased from the amount of exposure in the first exposure, such that the shape of the pattern of the masking layer 810 is controlled to be the same as the pattern of the masking layer 210. This permits the cross sectional shape of the finally produced quartz piece 170 to be produced as designed. The values of the amount of the first exposure and the second exposure in the present embodiment are only an example, and those skilled in the art can choose optimal values depending upon the thickness, light transmission, etc., of the quartz substrate 100.

The quartz pieces could be manufactured in accordance with the method of the present embodiment, so as to have external dimension within an error of 1 µm or less from the design value, and the cross sectional shape should not be distorted. Further, the error of the oscillating frequency of the quartz oscillators using the quartz pieces produced in accordance with the method of the present embodiment could be kept to several tens Hz from the design value. This is remarkable difference from the case of conventional quartz oscillators where oscillating frequency varies over the range of about 200 Hz from the design value.

In the method of the present embodiment, the patterned masking layer 210 formed on one of the surfaces of the quartz-substrate 100 serves as an exposure mask for a resist layer formed on the other surface of the quartz substrate. Therefore, the need of positional adjustment of a plurality of exposure masks can be eliminated. The manufacturing process is thereby simplified. The production of quartz pieces having distorted shape that may be produced due to error in positional adjustment of plural masks can be avoided.

Further, as the masking layers 210 and 810 of same material were formed on both surfaces of the quartz substrate 100 using lift-off method in the present embodiment, the etching solution could be used at higher temperature and in more highly activated state as compared to the first embodiment, so that processing time required in the etching of the quartz substrate could be reduced.

Thus, in accordance with the present invention, it is possible to manufacture quartz oscillators with high precision and high reliability.

Next, a method for manufacturing quartz oscillators according to a fourth embodiment of the present invention will be described with reference to FIG. 5.

Figure 5A:
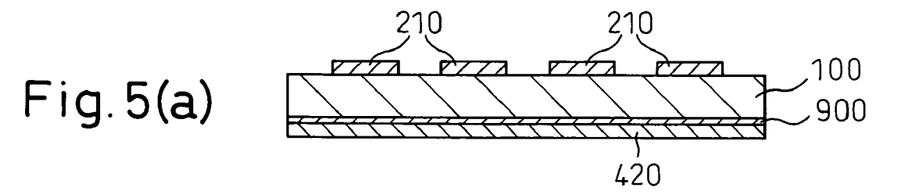
FIGS. 5(a)–(g) are views useful for explaining a method for manufacturing quartz oscillators according to a fourth embodiment of the present invention.

First, as shown in FIG. 5(a), a patterned masking layer 210, that is patterned as required, was formed on one surface of a quartz substrate 100. The masking layer 210 was a laminated film (Au/Cr film) consisting of an upper Au film of 0.1 µm in thickness and a lower Cr film of 0.05 µm in thickness. The method of forming the masking layer 210 was otherwise the same as the method shown in FIGS. 1(*a*)–(*e*) including the amount of the first exposure (see FIG. 1(*b*)), and detailed description thereof is therefore omitted.

On the other hand, a thin film masking layer 900 was formed all over the surface on the other side of the quartz substrate 100 having no masking layer 210 formed thereon by a sputtering method or a vapor deposition method. The thin film masking layer 900 was a laminated film (Au/Cr film) consisting of an upper Au film and a lower Cr film (on the side of the quartz substrate 100). The Au film had film thickness of 0.07 µm and the Cr film had film thickness of 0.03 µm. A resist layer 420 was formed on top of the thin film masking layer 900. The resist layer 420 was formed by coating a positive-type resist manufactured by Clariant Co. (Trade name: AZ-P1350) using spin coating method (6000 rpm, 30 seconds) to the thickness of about 0.4 µm and thereafter pre-baking it in an air circulating oven (90° C., for 20 minutes).

Then, as shown in FIG. 5(*b*), a second exposure was performed from the side of the quartz substrate 100 having the masking layer 210 formed thereon to expose a predetermined portion of the resist layer 420 to light via the quartz substrate 100 and the thin film masking layer 900. Although an Au/Cr film is usually opaque, the thin film masking layer 900 is so thin that some light is transmitted through it. The masking layer 210, on the contrary, has sufficient thickness to interrupt light almost completely. In the portion where the masking layer 210 had been formed, light was interrupted by the masking layer 210, and therefore, did not reach the resist layer 420. In the portion where the quartz substrate 100 was exposed, light did reach the resist layer 420, and the resist layer 420 was thus exposed to light in accordance with the pattern of the masking layer 210. The amount of exposure of the second exposure was chosen to be 800 mJ/cm$^2$.

Then, as shown in FIG. 5(*c*), a patterned resist layer 430 was formed by developing and partially removing the resist layer 420. As has been described before, as the resist layer 420 had been formed using a positive type resist, the portion which has been exposed to light was removed. Thus, a patterned resist layer 430 was formed in the portion where the masking layer 210 had not been formed so as to sandwich the quartz substrate 100. A special developing solution for AZ-P1350 was used for development of the resist layer 420.

Next, as shown in FIG. 5(*d*), the resist layer 430 was used as a mask to perform etching of the thin film masking layer 900 to form a patterned masking layer 910. Etching of the thin film masking layer 910 was performed using aqua regia for Au film and a nitric acid-based etching solution for Cr film.

Then, as shown in FIG. 5(*e*), the resist layer 430 was dissolved and removed. A special release solution for AZ-P1350 was used for dissolution and removal.

Then, as shown in FIG. 5(*f*), the patterned masking layer 210 and the patterned thin film masking layer 910 were used as masks for etching quartz substrate 100 to cut out quartz pieces 180. The etching was performed by soaking the quartz substrate 100 in an etching solution consisting of 50% aqueous solution of hydrofluoric acid at 70° C. for 2 hours. In this process, the masking layers 210 and 910 formed of Au/Cr film were not corroded by the etching solution.

Figure 5B:
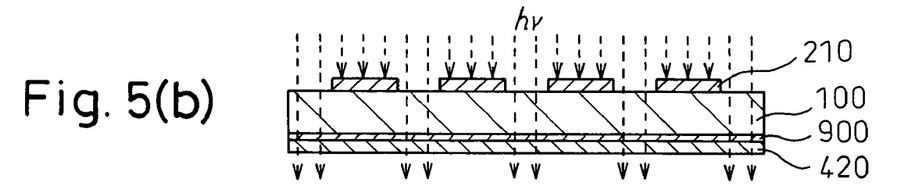
Figure 5C:
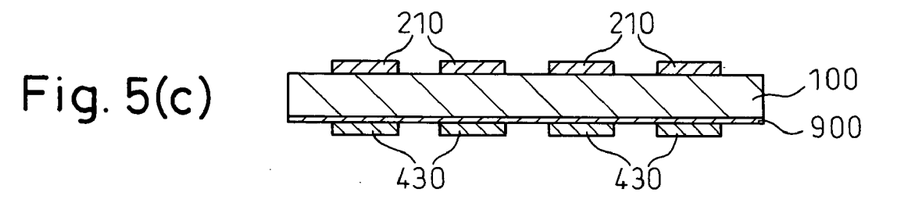
Figure 5D:
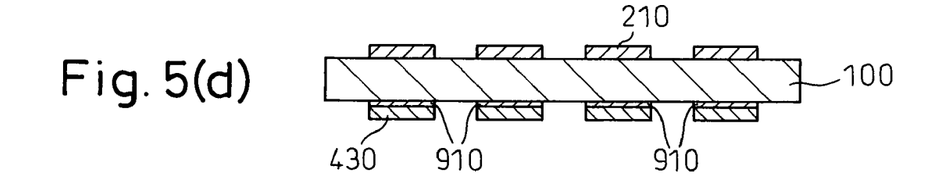
Figure 5E:
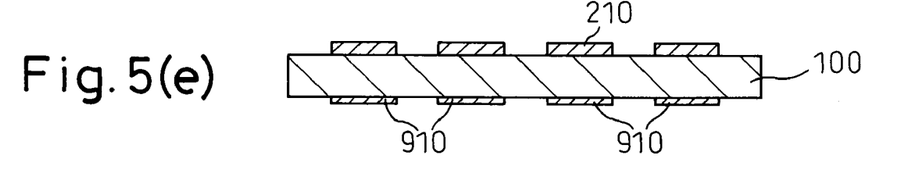
Figure 5F:
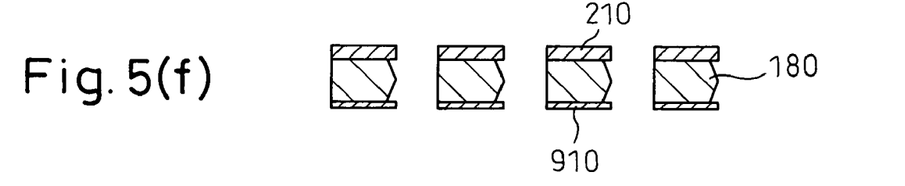
Figure 5G:
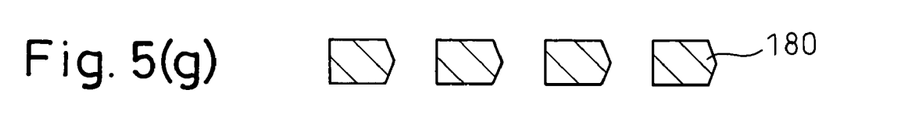

Usually, quartz is etched at different rate depending upon the etching direction. This phenomenon is generally referred to as anisotropic etching. For this reason, an inclined shape as shown in FIG. 5(*f*) is inevitably formed on one side of the etched quartz piece. However, as this inclined shape is determined by the crystal structure of the quartz, it is always formed in a definite amount. Therefore, variation of the external shape of quartz pieces 180 does not occur in the etching process.

Finally, as shown in FIG. 5(*g*), the masking layer 210 and the masking layer 910 are removed to complete the quartz pieces 180. In this step, as the masking layers 210 and 910 were both formed of Au/Cr film, both surfaces were simultaneously dissolved and removed by aqua regia and nitric acid-based etching solution.

Then, the step of forming electrodes for inducing oscillation in the quartz piece and the packaging step of mounting the quartz piece having electrodes formed thereon in a plastic container or the like, are performed to complete a quartz oscillator. Various methods known in the art can be employed in the electrode forming step and the packaging step.

The step shown in FIG. 5(*b*) is the most important step that is characteristic of the manufacturing method according to the present embodiment, wherein the patterned masking layer 210 formed on the quartz substrate 100 serves as the exposure mask for the other surface of the quartz substrate 100. As a result, the need for positional adjustment of plural exposure masks can be eliminated.

In the present embodiment, the first exposure for forming the masking layer 210 and the second exposure for forming the resist layer 430 for forming the thin film masking layer 910 are performed separately and are controlled such that the pattern of the masking layer 210 and the pattern of the thin film masking layer 910 have the same shape. When the resist layer 420 is exposed to light in FIG. 5(*b*) (the second exposure), light is attenuated and diffused in accordance with the light transmission of the quartz substrate 10 and the thin film masking layer 900. Therefore, if the amount of exposure in the case of exposing the resist layer 300 to light in FIG. 1(*b*) (the first exposure) is the same as the amount of exposure in the case of exposing the resist layer 420 to light in FIG. 5(*b*) (the second exposure), the shape of the pattern of the resist layer 430 formed in FIG. 5(*c*) becomes larger than the shape of the pattern of the masking layer 210. This occurs because the resist layer 420 is a positive type resist and the portion exposed to light is removed in the step of FIG. 5(*c*). Therefore, in the manufacturing method of the present embodiment, the amount of exposure in the second exposure shown in FIG. 5(*b*) is increased from the amount of exposure in the first exposure, such that the shape of the pattern of the thin film masking layer 910 is controlled to be the same as the pattern of the masking layer 210. This permits the cross sectional shape of the finally produced quartz piece 180 to be produced as designed. The values of the amount of the first exposure and the second exposure in the present embodiment are only an example, and those skilled in the art can choose optimal values depending upon the thickness, light transmission, etc., of the quartz substrate 100 and the thin film masking layer 900.

In the present embodiment, Au/Cr film consisting of Au film of 0.07 µm in thickness and Cr film of 0.03 µm in thickness was used as the thin film masking layer 900. However, another Au/Cr film may be used as long as it has light transmission sufficient to permit the resist layer 420 to be patterned, and has good resistance to corrosion during the etching step. Using light at the exposure wavelength ($\lambda$=405 nm), processing of quartz pieces was actually carried out for various combination of Au film-thickness and Cr film-thickness. The evaluation result as shown in the following Table 1 was obtained.

TABLE 1

| λ = 405 nm | | Cr (μm) | | | | |
|---|---|---|---|---|---|---|
| | 0.005 | 0.010 | 0.020 | 0.030 | 0.040 | 0.050 |
| Au (μm) 0.130 | 2 | 1 | 1 | 1 | 1 | 1 |
| 0.100 | 2 | 5 | 3 | 3 | 3 | 1 |
| 0.090 | 2 | 5 | 5 | 3 | 3 | 1 |
| 0.080 | 2 | 5 | 5 | 5 | 3 | 1 |
| 0.070 | 2 | 5 | 5 | 5 | 5 | 1 |
| 0.060 | 2 | 4 | 4 | 4 | 5 | 1 |
| 0.050 | 2 | 2 | 2 | 2 | 2 | 2 |

In table 1, evaluation score "5" indicates that good quartz pieces can be manufactured, evaluation score "4" indicates that good quartz pieces can be manufactured, provided that proper conditions are chosen for etching time, temperature, etc., in the step of etching the quartz substrate (see FIG. 5(f)), evaluation score "3" indicates that quartz pieces can be manufactured, but that possibility of defective products cannot be ruled out, evaluation score "2" indicates that good quartz pieces cannot be manufactured due to corrosion of film by the etching solution during etching of the quartz substrate, and evaluation score "1" indicates that good quartz pieces cannot be manufactured due to failure in patterning of the thin film masking later 910. If the evaluation score is "3" or higher, obtained quartz pieces can be considered to be actually useful.

Thus, if thickness of Au film is in the range of 0.06–0.1 μm and thickness of Cr film is in the range of 0.01–0.04 μm, it is possible to use the Au/Cr film for the thin film masking layer 900 of the present embodiment. Also, if light transmission of Au/Cr film is in the range of 0.4–1.7%, it is possible to use the Au/Cr film for the thin film masking layer 900 of the present embodiment.

The quartz pieces manufactured in accordance with the method of the present embodiment, had external dimension within an error of 1 μm or less from the design value, and the cross sectional shape was not distorted. Further, the error of the oscillating frequency of the quartz oscillators using the quartz pieces produced in accordance with the method of the present embodiment could be kept to several tens Hz from the design value. This is remarkable difference from the case of conventional quartz oscillators where oscillating frequency varies over the range of about 200 Hz from the design value.

In the method of the present embodiment, the patterned masking layer 210 formed on one of the surfaces of the quartz substrate 100 serves as an exposure mask for the other surface of the quartz substrate. Therefore, the need of positional adjustment of a plurality of exposure masks can be eliminated, and manufacturing process is thereby simplified. Production of quartz pieces having distorted shape, that may be produced due to error in positional adjustment of plural masks, can be avoided.

Further, as the masking layers 210 and 910 of same material were formed on both surfaces of the quartz substrate 100 using the thin film masking layer 900 in the present embodiment, the etching solution could be used at higher temperature and in more highly activated state as compared to the first embodiment, so that processing time required in the etching of the quartz substrate could be reduced.

Thus, in accordance with the present invention, quartz oscillators could be manufactured with high precision and high reliability.

What is claimed is:

1. A method for manufacturing a quartz oscillator comprising the steps of:
   forming a first resist layer on one surface of a quartz substrate;
   exposing said first resist layer to light of a first amount of exposure so as to expose a part of said first resist layer in a first exposure step;
   forming a patterned first masking layer by developing said exposed first resist layer;
   forming a second resist layer on the other surface of said quartz substrate;
   exposing said second resist layer to light of a second amount of exposure via said quartz substrate to form a patterned second masking layer by using said patterned first masking layer in a second exposure step; and
   etching said quartz substrate to cut out quartz pieces by using said patterned first masking layer and said patterned second masking layer.

2. A method for manufacturing a quartz oscillator according to claim 1, wherein said first amount of exposure and said second amount of exposure are selected such that the pattern of said patterned first masking layer and the pattern of said patterned second masking layer have substantially the same shape.

3. A method for manufacturing a quartz oscillator according to claim 1, wherein said first masking layer has corrosion resistance to the etching solution for etching said quartz substrate.

4. A method for manufacturing a quartz oscillator according to claim 1, wherein the step of forming said patterned second masking layer includes the step of forming said patterned second masking layer by removing the portion of said second resist layer that has been exposed to light.

5. A method for manufacturing a quartz oscillator according to claim 4, wherein said second resist layer is formed of a photosensitive material which has corrosion resistance to the etching solution for etching said quartz substrate, and of which the portion exposed to light is dissolved and removed.

6. A method for manufacturing a quartz oscillator according to claim 1, further comprising the step of:
   forming, between said second resist layer and said quartz substrate, a transparent masking layer which has transparency and has corrosion resistance to the etching solution for etching said quartz substrate.

7. A method for manufacturing a quartz oscillator according to claim 6, wherein the step of forming said patterned second masking layer includes the steps of:
   forming a patterned second resist layer by removing the portion of said second resist layer which has been exposed to light; and
   patterning the transparent masking layer to form said patterned second masking layer by using said patterned second resist layer as a mask.

8. A method for manufacturing a quartz oscillator according to claim 1, wherein the step of forming said patterned second masking layer includes the steps of:
   forming a patterned second resist layer by removing the portion of said resist layer other than the portion exposed to light;
   forming the second masking layer over said patterned second resist layer; and
   removing said patterned second resist layer to form said patterned second masking layer.

9. A method for manufacturing a quartz oscillator according to claim 1, further comprising the step of:
forming a film masking layer between said second resist layer and said quartz substrate.

10. A method for manufacturing a quartz oscillator according to claim 9, wherein the step of forming said patterned second masking layer includes the steps of:
removing the portion of said second resist layer which has been exposed to light to form a patterned second resist layer; and
patterning the film masking layer to form said patterned second masking layer by using said patterned second resist layer as a mask.

11. A method for manufacturing a quartz oscillator according to claim 10, wherein said film masking layer is a laminated film including an Au film and a Cr film.

12. A method for manufacturing a quartz oscillator according to claim 11, wherein said film masking layer has light transmittance of 0.4%–1.7%.

13. A method for manufacturing a quartz oscillator according to claim 11, wherein said Au film has a film thickness of 0.06–0.10 μm.

14. A method for manufacturing a quartz oscillator according to claim 11, wherein said Cr film has a film thickness of 0.01–0.05 μm.

15. A method for manufacturing a quartz oscillator according to claim 1, further comprising the steps of:
attaching electrodes to said quartz piece; and
mounting said quartz piece having electrodes attached thereto in a container.

16. A method for manufacturing a quartz oscillator according to claim 1, wherein said first amount of exposure and said second amount of exposure are determined separately.

17. A method for manufacturing a quartz oscillator according to claim 1, wherein said first amount of exposure and said second amount of exposure are determined so that said patterned first masking layer and said patterned second masking layer have the same shape.

* * * * *